United States Patent
Amachi et al.

[11] Patent Number: 5,874,859
[45] Date of Patent: Feb. 23, 1999

[54] HIGH-FREQUENCY AMPLIFIER INTEGRATED-CIRCUIT DEVICE

[75] Inventors: Nobumitsu Amachi, Kusatsu; Yasushi Yamamoto, Yasu-gun; Koichi Sakamoto, Ohtsu; Mitsuhiro Tsuchioka, Omihachiman, all of Japan

[73] Assignee: Murata Manufacturing Co., Ltd., Japan

[21] Appl. No.: 738,022

[22] Filed: Oct. 25, 1996

[30] Foreign Application Priority Data

Oct. 26, 1995 [JP] Japan ................................. 7-278744

[51] Int. Cl.⁶ ............................................ H03F 3/16
[52] U.S. Cl. ................................. 330/277; 330/307
[58] Field of Search ........................ 330/65, 66, 67, 330/68, 277, 286, 307

[56] References Cited

U.S. PATENT DOCUMENTS

| | | | |
|---|---|---|---|
| 4,298,846 | 11/1981 | Hirano et al. | 333/32 |
| 4,658,220 | 4/1987 | Heston et al. | 330/277 |
| 4,771,247 | 9/1988 | Jacomb-Hood | 330/277 |
| 5,233,313 | 8/1993 | Kohno et al. | 330/277 |
| 5,386,130 | 1/1995 | Gamand et al. | 257/275 |
| 5,469,108 | 11/1995 | Tserng | 330/286 |

*Primary Examiner*—Steven Mottola
*Attorney, Agent, or Firm*—Ostrolenk, Faber, Gerb & Soffen, LLP

[57] ABSTRACT

A high-frequency amplifying integrated-circuit device is provided in which variations of gain can be reduced and which can be manufactured at a low cost as compared with prior art devices. A high-frequency amplifying integrated-circuit device includes a semiconductor substrate; and a transistor which is formed on the semiconductor substrate and which has a plurality of first electrodes, a plurality of second electrodes, and at least one third electrode, a high-frequency signal input to the plurality of second electrodes being amplified by the transistor and output from the third electrode, wherein at least two first electrodes from among the plurality of first electrodes are each grounded via a capacitor, and the electrostatic capacitance values of the two capacitors are set at mutually different values.

28 Claims, 7 Drawing Sheets

HIGH-FREQUENCY AMPLIFIER INTEGRATED-CIRCUIT DEVICE

BACKGROUND OF THE INVENTION

1. Field of the Invention

The present invention relates to a high-frequency amplifying integrated-circuit device formed on a semiconductor substrate.

2. Description of the Related Art

In recent years, microwaves and millimeter waves have come to be widely used.

Progress has been made in the formation of high-frequency circuits into monolithic ICs to achieve small size and light weight. Under these circumstances, intense efforts are being made to develop a high-frequency amplifying integrated-circuit device suitable for use as an MMIC as well.

FIG. 5 is a plan view illustrating the construction of a conventional high-frequency amplifying integrated-circuit device 92 mounted on the top surface of a mother board 100. The high-frequency amplifying integrated-circuit device 92 of FIG. 5 comprises a field-effect transistor 1, an inductor 41, spiral inductors 142, 51 and 52, a capacitor 31, and a self-bias resistor 21 on the top surface of a semiconductor substrate 10, on the bottom surface of which a grounding conductor is formed. The high-frequency amplifying integrated-circuit device 92 is formed as described below.

As shown in FIG. 5A, the field-effect transistor 1 comprising a gate electrode 11, a drain electrode 12, and a source electrode 13 is formed on the top surface of the semiconductor substrate 10 made of GaAs or the like. Here, the gate electrode 11 is formed of a first gate electrode 11a, a second gate electrode 11b, a third gate electrode 11c, a fourth gate electrode 11d, and a gate electrode terminal 11t. The drain electrode 12 is formed of a first drain electrode 12a, a second drain electrode 12b, and a drain electrode terminal 12t. The source electrode 13 is formed of a first source electrode 13a, a second source electrode 13b, a third source electrode 13c, a connection electrode 13s, and a connection section 13t1. Each of the above elements are formed so as to be positioned as described below. Here, the connection section 13t1 is a boundary portion between the third source electrode 13c and a connection conductor 14a.

More specifically, the first gate electrode 11a is positioned between the first source electrode 13a and the first drain electrode 12a. The second gate electrode 11b is positioned between the first drain electrode 12a and the second source electrode 13b. The third gate electrode 11c is positioned between the second source electrode 13b and the second drain electrode 12b. The fourth gate electrode 11d is positioned between the second drain electrode 12b and the third source electrode 13c.

An inductor 41 is formed of a strip electrode formed on the top surface of the semiconductor substrate 10, with one end thereof being connected to the gate electrode terminal 11t of the gate electrode 11 of the field-effect transistor 1 and the other end thereof being connected to a terminal conductor 71 substantially in a square shape formed on the top surface of the semiconductor substrate 10. The terminal conductor 71 is connected by a bonding wire 61 to an input terminal 101 formed on the top surface of the mother board 100. Here, a grounding conductor is formed on the bottom surface of the semiconductor substrate 10. A spiral inductor 142 has a strip electrode formed in a spiral shape on the top surface of the semiconductor substrate 10, with one end thereof being connected to the terminal conductor 71 and the other end being connected to a terminal conductor 74 substantially in a square shape formed on the top surface of the semiconductor substrate 10. The terminal conductor 74 is connected by a bonding wire 66 to a grounding conductor 103 formed on the top surface of the mother board 100.

A spiral inductor 51 is formed of a strip electrode formed in a spiral shape on the top surface of the semiconductor substrate 10, with one end thereof being connected to the drain electrode terminal 12t of the drain electrode 12 of the field-effect transistor 1 and the other end being connected to a terminal conductor 72 substantially in a square shape formed on the top surface of the semiconductor substrate 10. The terminal conductor 72 is connected by a bonding wire 63 to an output terminal 102 formed on the top surface of the mother board 100. A spiral inductor 52 is formed of a strip electrode formed in a spiral shape on the top surface of the semiconductor substrate 10, with one end thereof being connected to the terminal conductor 72 and the other end being connected to a terminal conductor 73 substantially in a square shape formed on the top surface of the semiconductor substrate 10. The terminal conductor 73 is connected by a bonding wire 64 to the grounding conductor 103 formed on the top surface of the mother board 100.

The capacitor 31 is formed at a position between the connection conductor 14a and a grounding conductor 81. The self-bias resistor 21 is formed at a position between the connection conductor 14a and the grounding conductor 81. The grounding conductor 81 is connected by a bonding wire 65 to the grounding conductor 103 of the mother board 100. As a result, the third source electrode 13c is grounded via a parallel circuit of the capacitor 31 and the self-bias resistor 21.

FIG. 6 is a circuit diagram of the high-frequency amplifying integrated-circuit device 92 of FIG. 5. In the conventional high-frequency amplifying integrated-circuit device 92 constructed as described above, the bonding wires 61, 63, 64, 65 and 66 function as inductors at high frequencies. Therefore, in the conventional high-frequency amplifying integrated-circuit device 92, the respective values of the inductor 41, the spiral inductors 142, 51 and 52, and the capacitor 31 are set so as to have a desired gain at a predetermined frequency by taking the inductance values of the bonding wires 61, 63, 64, 65 and 66 into consideration.

FIG. 7 is a graph illustrating the frequency characteristic of the output end reflection coefficient and the gain in the high-frequency amplifying integrated-circuit device 92 of FIG. 5, when the values of the inductor 41, the spiral inductors 51, 52 and 142, and the capacitor 31 are set and the lengths L of the bonding wires 61, 63, 64, 65 and 66 are varied as described below:

(1) The inductance value of the inductor 41=0.48 nH, (2) The inductance value of the spiral inductor 142=1.3 nH, (3) The inductance value of the spiral inductor 51=0.65 nH, (4) The inductance value of the spiral inductor 52=1.2 nH, (5) The electrostatic capacitance value of the capacitor 31=3 pF, (6) The resistance value of the self-bias resistor 21=50 ohms.

Here, the lengths L of the bonding wires 61, 63, 64, 65 and 66 are set at values of 240 μm, 300 μm and 360 μm, and the frequency characteristic of the output end reflection coefficient and the gain is shown for each case. As can be seen in FIG. 7, there is a gain of approximately 7 dB at the frequency of 10 GHz. That is, the conventional high-frequency amplifying integrated-circuit device 92 constructed as described above amplifies an input high-frequency signal having a predetermined frequency and outputs the amplified signal.

However, when the conventional high-frequency amplifying integrated-circuit device 92 is operated at a frequency exceeding 10 GHz, there are problems. For example, the high-frequency amplifying integrated-circuit device 92 is greatly affected by variations in the inductance values caused by the variations of the lengths L of the bonding wires 61, 63, 64, 65 and 66. Therefore, when the high-frequency amplifying integrated-circuit device 92 is mounted on the mother board 100, variations of the gain are increased at a predetermined frequency. Also, in some cases, these variations of the inductance values of the bonding wires 61, 63, 64, 65 and 66 may cause parasitic oscillation to occur, causing the amplification operation to become unstable. As a result, the yield during mass production is decreased and the manufacturing costs are increased, so the high-frequency amplifying integrated-circuit device 92 cannot be manufactured at a low cost.

SUMMARY OF THE INVENTION

It is an object of the present invention to provide a high-frequency amplifying integrated-circuit device in which the above-described problems are solved and variations of gain can be decreased, and which can be manufactured at a lower cost than prior art devices.

The high-frequency amplifying integrated-circuit device according to an embodiment of the present invention comprises a semiconductor substrate; and a transistor which is formed on the semiconductor substrate and which has a plurality of first electrodes, a plurality of second electrodes, and at least one third electrode, for amplifying a high-frequency signal input to the plurality of second electrodes and outputting an amplified signal from the third electrode, wherein at least two first electrodes from among the plurality of first electrodes are each grounded via a capacitor.

According to another aspect of the invention, the high-frequency amplifying integrated-circuit device further comprises at least two grounding conductors formed on the semiconductor substrate, to which the at least two first electrodes are each connected each via a capacitor, wherein the at least two grounding conductors are connected to each other outside the semiconductor substrate.

The electrostatic capacitance values of the two capacitors are preferably set at mutually different values, the capacitance of one capacitor being set at a value within a range of 3 to 50 times as great as that of the other capacitor.

According to another aspect of the invention, the high-frequency amplifying integrated-circuit device is provided on a mother substrate and comprises first terminals connected to the plurality of first electrodes and second terminals connected to the third electrode, wherein the first terminals, the second terminals and at least two of the grounding conductors are each connected by wire bonding to terminals formed on the mother substrate.

The above and further objects, aspects and novel features of the invention will become more apparent from the following detailed description when read in connection with the accompanying drawings.

DETAILED DESCRIPTION OF AN EMBODIMENT OF THE INVENTION

Figure 1:
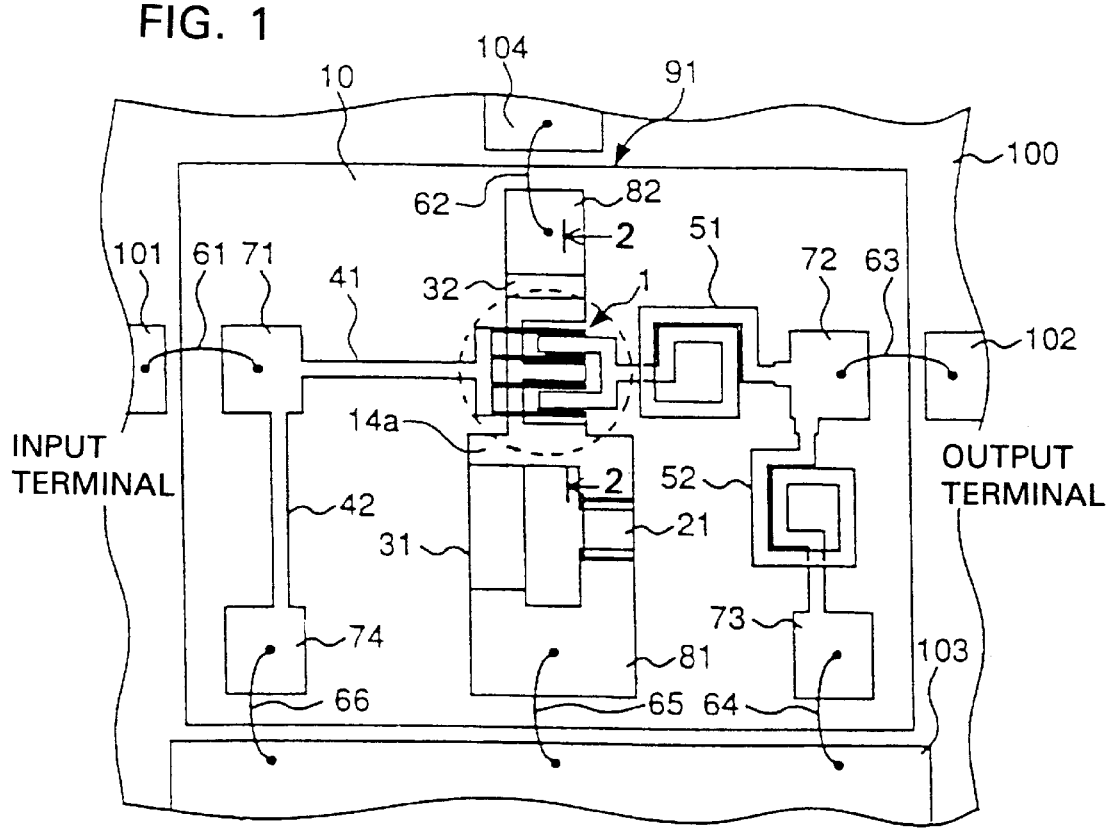
FIG. 1 is a plan view of a high-frequency amplifying integrated-circuit device 91 mounted on a mother board 100 according to an embodiment of the present invention.
Figure 1A:
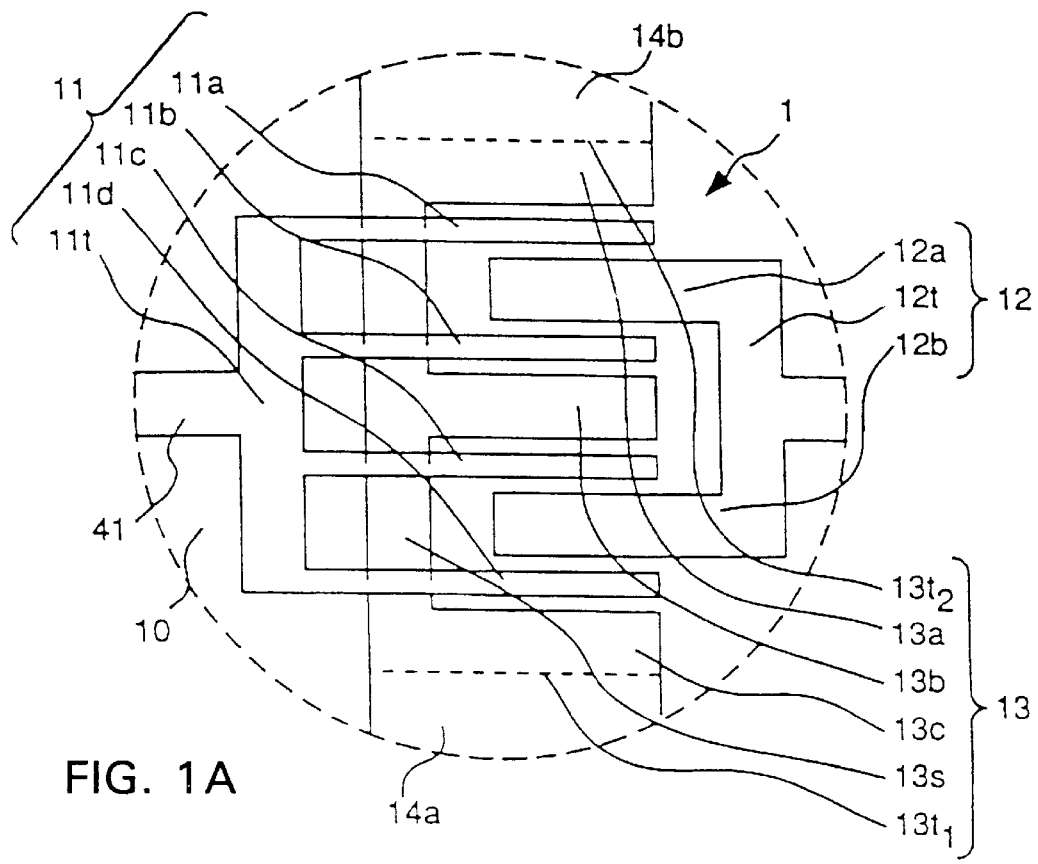
FIG. 1A is an enlarged detail view showing part of FIG. 1.
Figure 2:
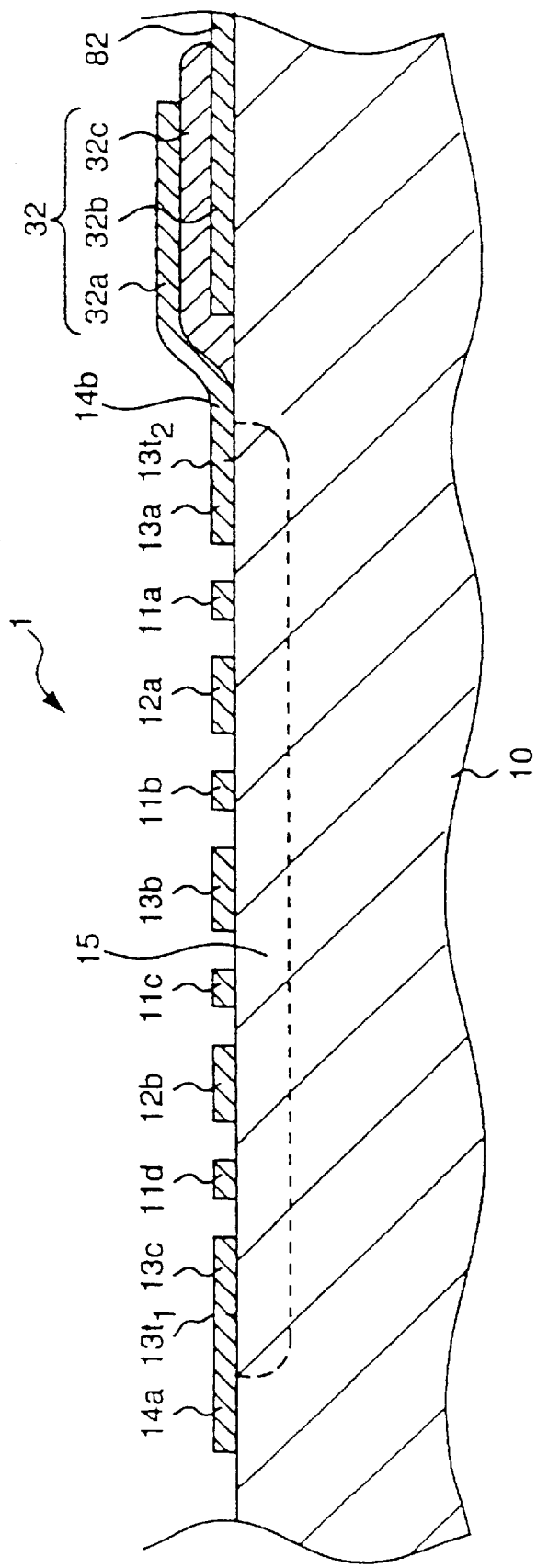
FIG. 2 is a sectional view taken along the line 2—2 of FIG. 1.
Figure 5:
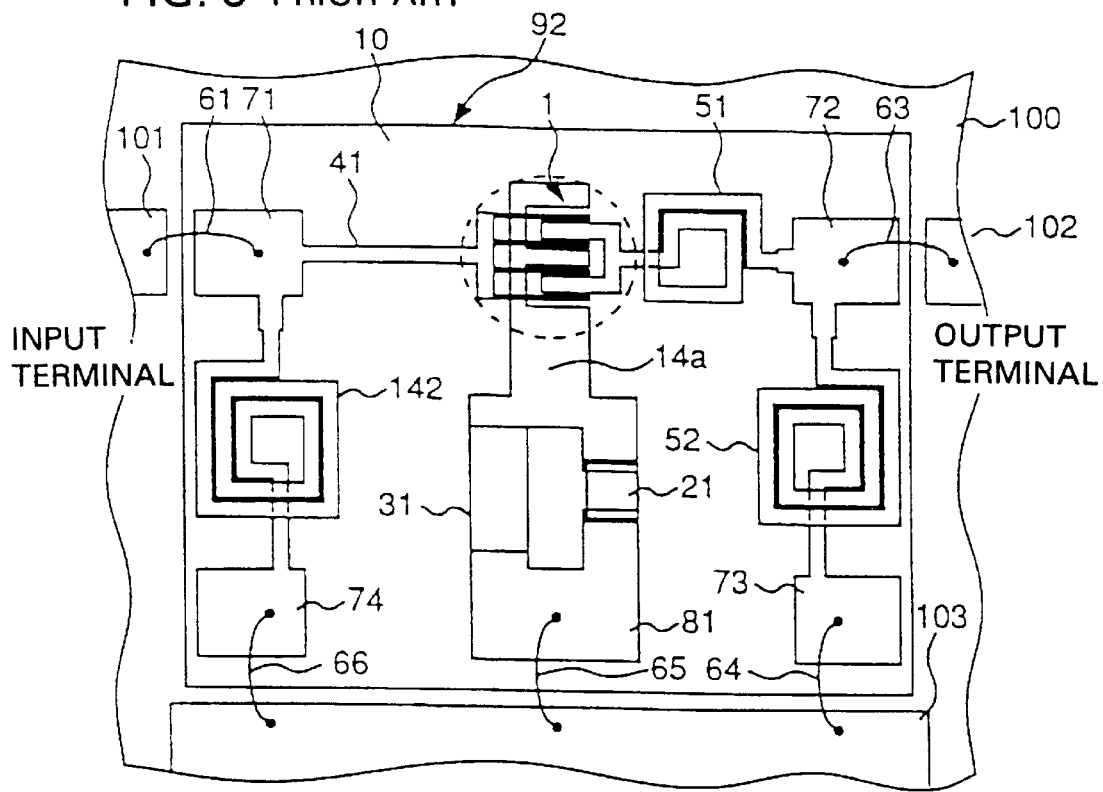
FIG. 5 is a plan view of a conventional high-frequency amplifying integrated-circuit device 92.
Figure 5A:
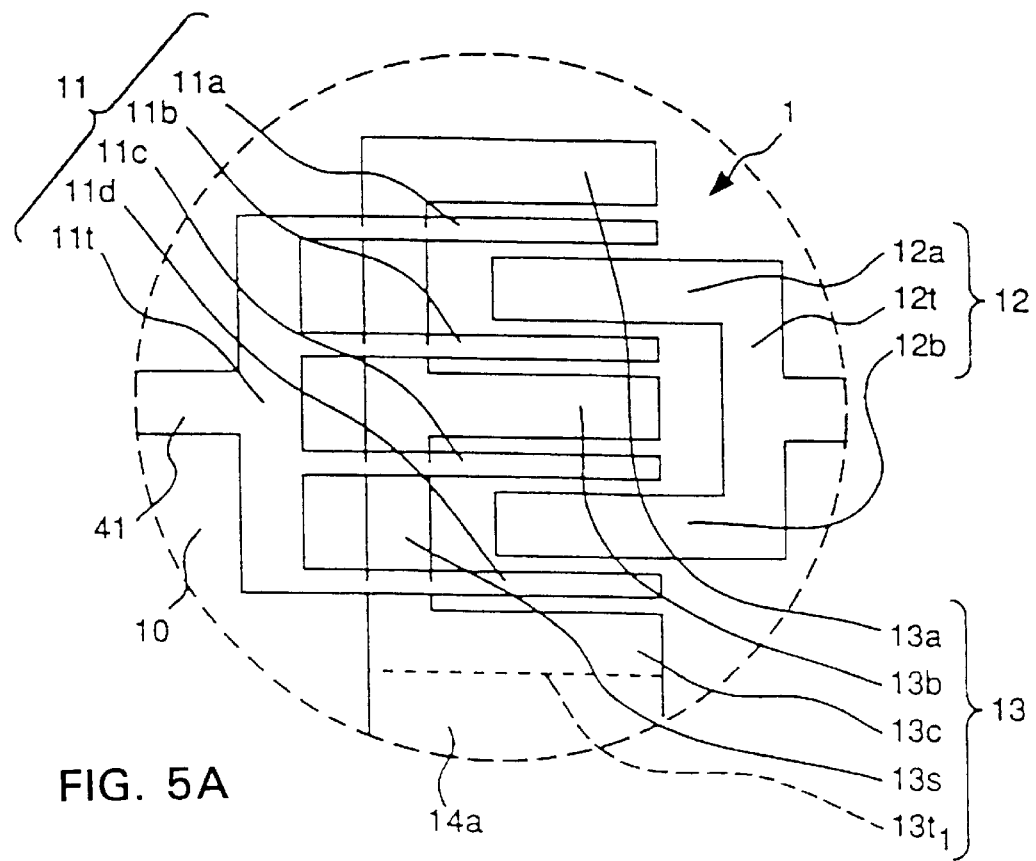
FIG. 5A is an enlarged detail view showing part of FIG. 5.
Figure 6:
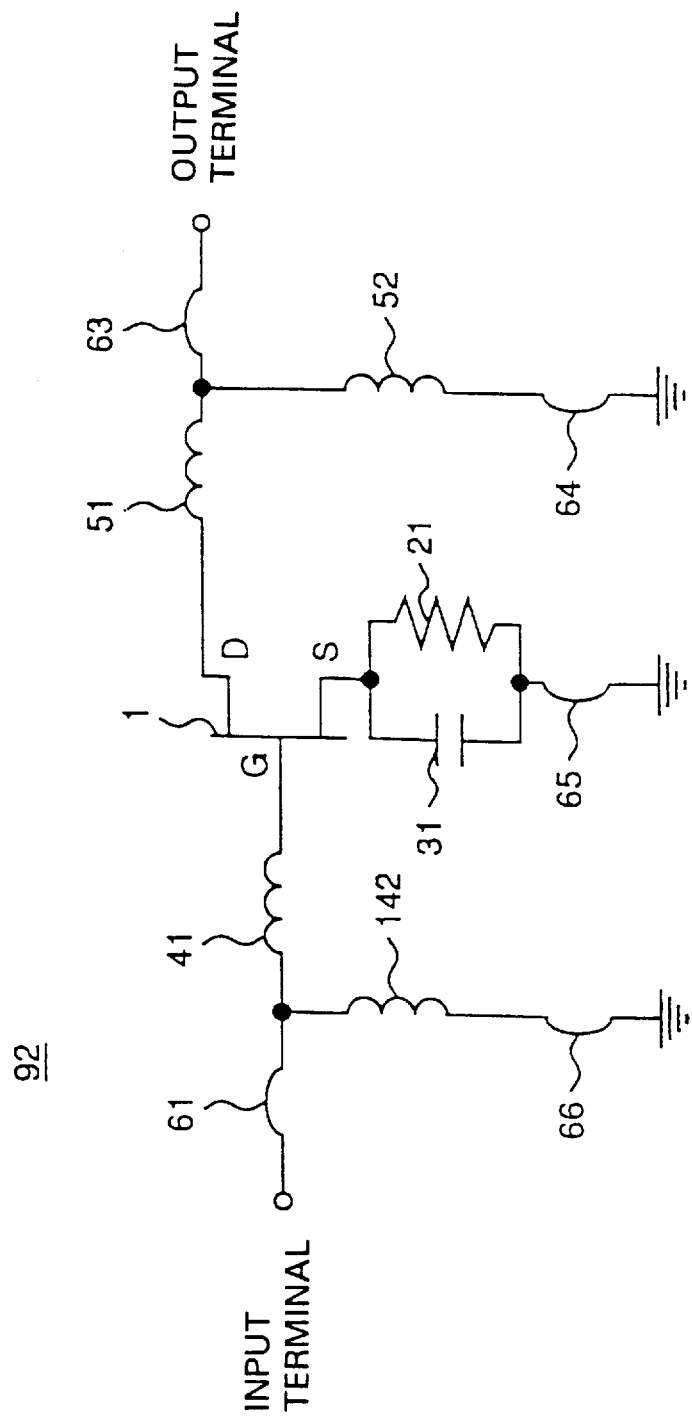
FIG. 6 is a circuit diagram of the high-frequency amplifying integrated-circuit device 92 of FIG. 5.

FIG. 1 is a plan view illustrating the construction of a high-frequency amplifying integrated-circuit device 91 mounted on the top surface of a mother board 100 according to an embodiment of the present invention. A feature of the high-frequency amplifying integrated-circuit device 91 is that a capacitor 32 is connected between a first source electrode 13a and a grounding conductor 82 as compared with the prior art of FIG. 5. The construction of the embodiment of the present invention will now be described below in detail with reference to FIGS. 1, 1A and 2, in which FIG. 1 is a plan view of the device, FIG. 1A is an enlarged detail view of part of FIG. 1; and FIG. 2 is a sectional view taken along the line 2—2 of FIG. 1.

In the high-frequency amplifying integrated-circuit device 91 of FIG. 1, a field-effect transistor 1 is formed on an active layer 15 of the semiconductor substrate 10 made of GaAs. Here, a grounding conductor (not shown) is formed on the bottom surface of a semiconductor substrate 10. Referring to FIG. 1A, the field-effect transistor 1 comprises a gate electrode 11, a drain electrode 12 and a source electrode 13. The gate electrode 11 is formed of a first gate electrode 11a, a second gate electrode 11b, a third gate electrode 11c, a fourth gate electrode 11d and a gate electrode terminal 11t. The drain electrode 12 is formed of a first drain electrode 12a, a second drain electrode 12b and a drain electrode terminal 12t. The source electrode 13 is formed of a first source electrode 13a, a second source electrode 13b, a third source electrode 13c and a connection electrode 13s. Each of the above elements are formed so as to be positioned as described below.

More specifically, the first gate electrode 11a, the second gate electrode 11b and the third gate electrode 11c are provided side by side so as to be parallel to each other. The first gate electrode 11a is positioned between the first source electrode 13a and the first drain electrode 12a with a predetermined spacing from the first source electrode 13a and the first drain electrode 12a. The second gate electrode 11b is positioned between the first drain electrode 12a and the second source electrode 13b with a predetermined spacing from the first drain electrode 12a and the second source electrode 13b. The third gate electrode 11c is positioned between the second source electrode 13b and the second drain electrode 12b with a predetermined spacing from the second source electrode 13b and the second drain electrode 12b. The fourth gate electrode 11d is positioned between the second drain electrode 12b and the third source electrode 13c with a predetermined spacing from the second drain electrode 12b and the third source electrode 13c. Therefore, the first gate electrode 11a, the second gate electrode 11b, the third gate electrode 11c, the first source electrode 13a, the second source electrode 13b, the third source electrode 13c, the first drain electrode 12a and the second drain electrode 12b are formed so as to be parallel to each other.

Here, the first gate electrode 11a, the second gate electrode 11b, the third gate electrode 11c and the fourth gate electrode 11d are each connected to the gate electrode terminal 11t. The first drain electrode 12a and the second drain electrode 12b are each connected to the drain electrode terminal 12t. The first source electrode 13a, the second source electrode 13b and the third source electrode 13c are each connected to the connection electrode 13s.

In the first embodiment, the gate length of the field-effect transistor 1 is set at 0.5 μm, and the gate width at 200 μm. The connection section 13t1 is a boundary portion between the third source electrode 13c and the connection conductor 14a. The connection section 13t2 is a boundary portion between the first source electrode 13a and a connection conductor 14b. Therefore, the source electrode 13 is connected to the connection conductor 14a via the connection section 13t1 and is connected to the connection conductor 14b via the connection section 13t2.

The inductor 41 is formed of a strip electrode formed on the top surface of the semiconductor substrate 10, one end of which inductor is connected to the first gate electrode 11a, the second gate electrode 11b, the third gate electrode 11c and the fourth gate electrode 11d each via the gate electrode terminal 11t and the other end of which inductor is connected to the terminal conductor 71 substantially in a square shape formed on the top surface of the semiconductor substrate 10.

The terminal conductor 71 is connected by the bonding wire 61 to the input terminal 101 formed on the top surface of the mother board 100. Here, the mother board 100 is made of alumina, a resin or the like. A grounding conductor is formed on the bottom surface of the mother board 100.

The high-frequency amplifier integrated-circuit device 91 is mounted at a predetermined position on the top surface of the mother board 100, and a high-frequency oscillator or the like are formed at another portion. Thus, for example, a high-frequency receiving circuit is formed. In such a case, the high-frequency amplifying integrated-circuit device 91 is bonded to the top surface of the by bonding the grounding conductor formed on the bottom surface of the semiconductor substrate 10 to the conductor film formed on the top surface of the mother board 100 by, for example, heating.

An inductor 42 is formed of a strip electrode formed on the top surface of the semiconductor substrate 10, one end of which inductor is connected to the terminal conductor 71 and the other end of which inductor is connected to the terminal conductor 74 substantially in a square shape formed on the top surface of the semiconductor substrate 10. The terminal conductor 74 is connected by the bonding wire 66 to the grounding conductor 103 formed on the top surface of the mother board 100.

The spiral inductor 51 is formed of a strip electrode formed in a spiral shape on the top surface of the semiconductor substrate 10, one end of which spiral inductor is connected to the first drain electrode 12a and the second drain electrode 12b via the drain electrode terminal 12t and the other end of which spiral inductor is connected to the terminal conductor 72 substantially in a square shape formed on the top surface of the semiconductor substrate 10. The terminal conductor 72 is connected by the bonding wire 63 to the output terminal 102 formed on the top surface of the mother board 100. The spiral inductor 52 is formed of a strip electrode formed in a spiral shape on the top surface of the semiconductor substrate 10, one end of which spiral inductor is connected to the terminal conductor 72 and the other end of which spiral inductor is connected to the terminal conductor 73 substantially in a square shape formed on the top surface of the semiconductor substrate 10. The terminal conductor 73 is connected by the bonding wire 64 to the grounding conductor 103 formed on the top surface of the mother board 100. Here, in the spiral inductors 51 and 52, the strip electrodes are formed with an insulating film (not shown) sandwiched therebetween, to insulate the two intersecting strip electrodes from each other where they intersect.

The capacitor 32 is connected between the connection conductor 14b and the grounding conductor 82. As seen in FIG. 2, the capacitor 32 is formed on the top surface of the semiconductor substrate 10, and has a lower electrode 32b and an upper electrode 32a, between which a dielectric film 32c made of, for example, $SiO_2$ is sandwiched. The lower electrode 32b is formed so as to be connected to the grounding conductor 82, and the upper electrode 32a is connected to the first source electrode 13a via the connection conductor 14b. The grounding conductor 82 is connected by a bonding wire 62 to a grounding conductor 104 formed on the top surface of the mother board 100. Thus, the first source electrode 13a is grounded via the capacitor 32.

The capacitor 31 is formed on the top surface of the semiconductor substrate 10 in the same way as the capacitor 32 and is formed between the connection conductor 14a and the grounding conductor 81. The grounding conductor 81 is connected by the bonding wire 65 to the grounding conductor 104 formed on the top surface of the mother board 100. Thus, the third source electrode 13c is grounded via the capacitor 31. The self-bias resistor 21 is formed parallel to the capacitor 31 between the connection conductor 14a and the grounding conductor 81. Thus, a self-bias voltage proportional to the resistance value of the self-bias resistor 21 is applied to the source electrode 13.

In the high-frequency amplifying integrated-circuit device 91 of this embodiment, the electrostatic capacitance value of the capacitor 31 and the electrostatic capacitance value of the capacitor 32 are set at mutually different values. The electrostatic capacitance value of the capacitor 32 is preferably set at a predetermined value in a range of 3 to 50 times as great as the electrostatic capacitance value of the capacitor 31.

More preferably, the electrostatic capacitance value of the capacitor 32 is set at a value of 40 times as great as the electrostatic capacitance value of the capacitor 31.

However, the present invention is not limited to this example. It is also possible, for example, to set the electrostatic capacitance value of the capacitor 31 at a predetermined value in a range of 3 to 50 times as great as the electrostatic capacitance value of the capacitor 32, or more preferably at a value of 40 times as great as the electrostatic capacitance value of the capacitor 32.

That is, in the present invention, preferably, the electrostatic capacitance value of either one of the capacitors 31 and 32 is set at a predetermined value in a range of 3 to 50 times as great as the electrostatic capacitance value of the other capacitor, and more preferably, the electrostatic capacitance value of either one of the capacitors 31 and 32 is set at a predetermined value of 40 times as great as the electrostatic capacitance value of the other capacitor.

The grounding conductor 81 and the grounding conductor 82 are formed so as to be electrically separated on the semiconductor substrate 10, and are connected by the bonding wires 65 and 62 to the grounding conductor 103 and the grounding conductor 104, respectively. Thus, they are connected only outside the semiconductor substrate 10. In such a way, the high-frequency amplifying integrated-circuit device of this embodiment is formed.

Figure 3:
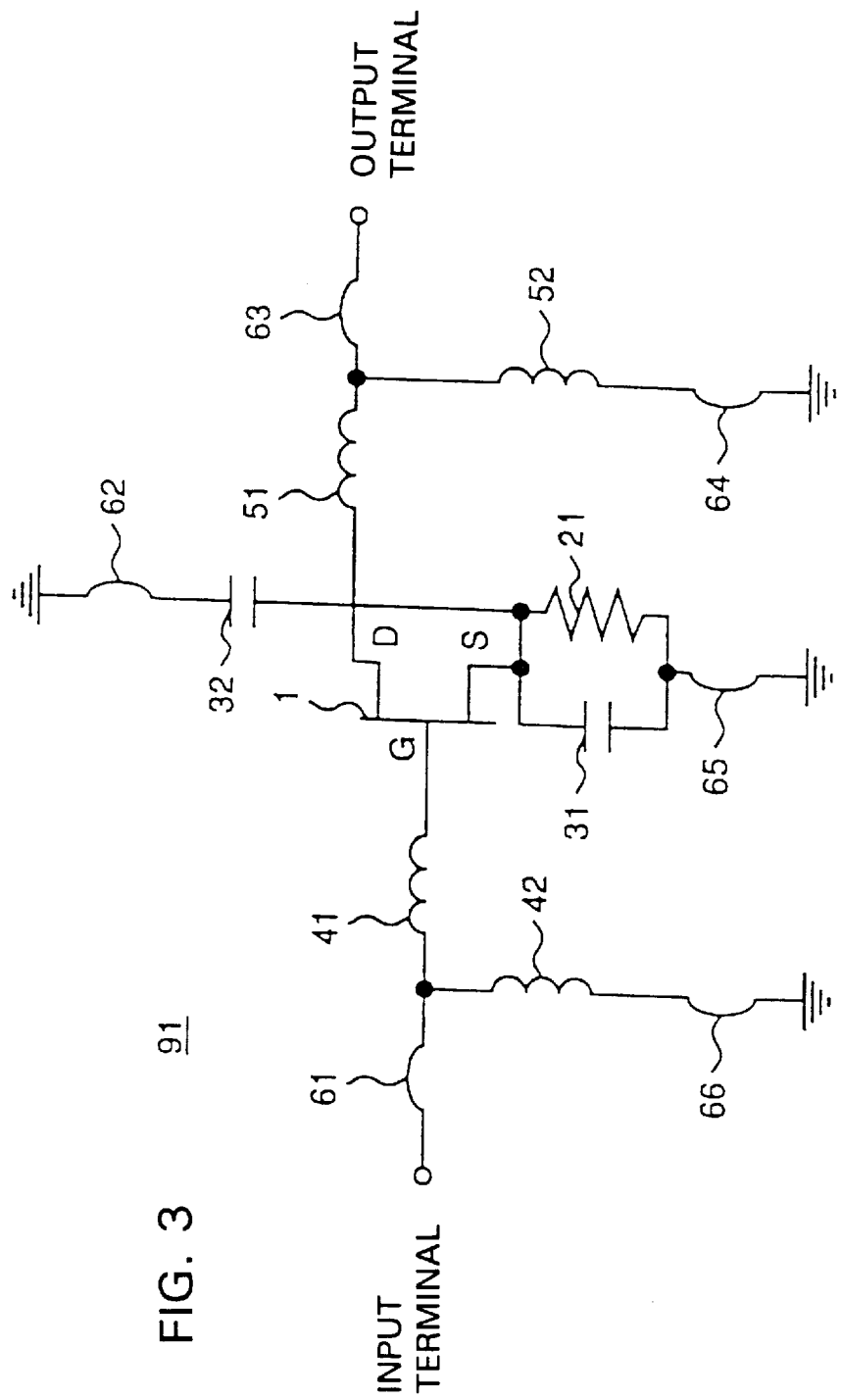
FIG. 3 is a circuit diagram of the high-frequency amplifying integrated-circuit device 91 of FIG. 1.

FIG. 3 is a circuit diagram of the high-frequency amplifying integrated-circuit device 91 of this embodiment. In such high-frequency amplifying integrated-circuit device 91, the bonding wires 61, 63, 64, 65 and 66 operate as inductors. Therefore, in the high-frequency amplifying integrated-circuit device 91 of this embodiment, the values of the inductors 41 and 42, the spiral inductors 51 and 52, and the capacitors 31 and 32 are set in order that such high-frequency amplifying integrated-circuit device 91 has a desired gain at a predetermined frequency.

The high-frequency amplifying integrated-circuit device 91 constructed as described above amplifies a signal having a predetermined frequency which is input to the gate electrode 11 via the inductor 41 by means of the field-effect transistor 1 and outputs the amplified signal via the spiral inductor 51.

Figure 4:
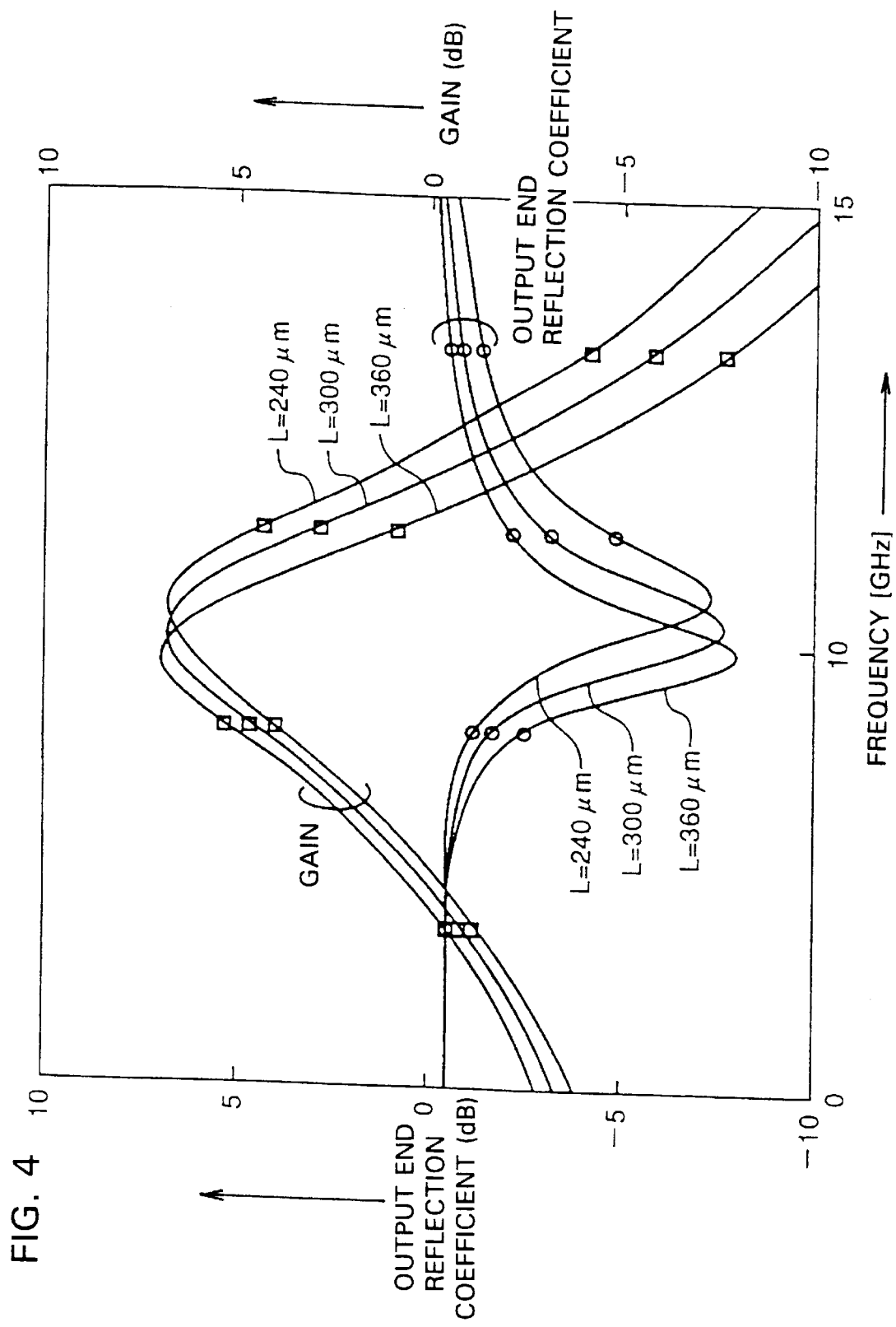
FIG. 4 is a graph illustrating the frequency characteristic of the output end reflection coefficient and the gain of the high-frequency amplifying integrated-circuit device 91 of FIG. 1.

FIG. 4 is a graph illustrating the frequency characteristic of the output end reflection coefficient and the gain when the values of the inductor 41, the spiral inductors 142, 51 and 52, and the capacitor 31 are set and the lengths L of the bonding wires 61, 63, 64, 65 and 66 are varied as described below.

(1) The inductance value of the inductor 41=0.48 nH
(2) The inductance value of the inductor 42=0.5 nH
(3) The inductance value of the spiral inductor 51=0.65 nH
(4) The inductance value of the spiral inductor 52=0.62 nH
(5) The electrostatic capacitance value of the capacitor 31=0.06 pF
(6) The electrostatic capacitance value of the capacitor 32=2.4 pF
(7) The resistance value of the self-bias resistor 21=50 ohms.

As is clear from (5) and (6) above, the electrostatic capacitance value of the capacitor 32 is set at 40 times as great as the electrostatic capacitance value of the capacitor 31.

Figure 7:
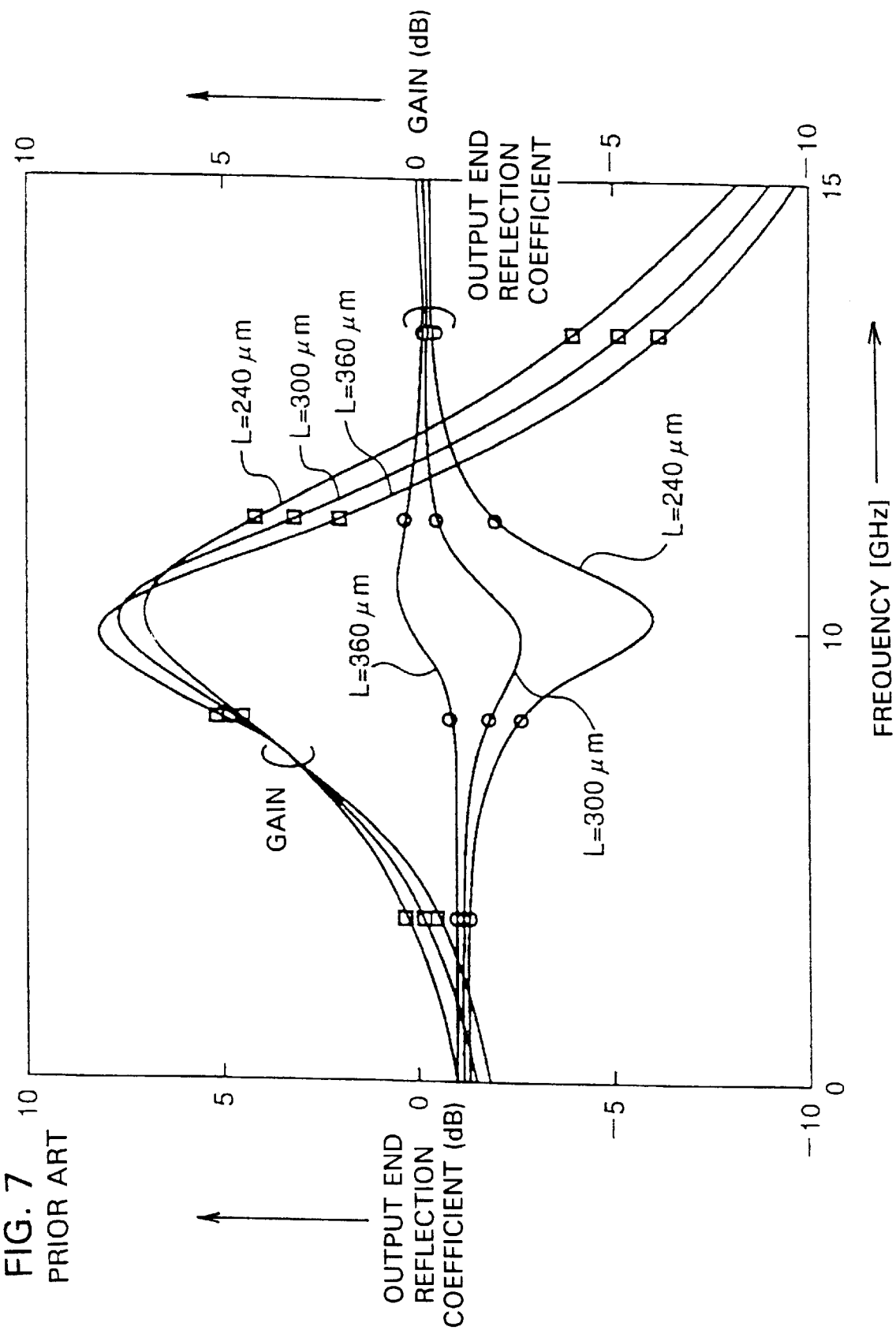
FIG. 7 is a graph illustrating the frequency characteristic of the output end reflection coefficient and the gain of the high-frequency amplifying integrated-circuit device 92 of FIG. 5.

FIG. 4 shows the frequency characteristic of the output end reflection coefficient and the gain when the lengths L of the bonding wires 61, 63, 64, 65 and 66 are set at 240 μm, 300 μm and 360 μm. As is clear from FIG. 4, the high-frequency amplifying integrated-circuit device 91 of this embodiment has a gain of approximately 7 dB at the frequency of 10 GHz. A comparison of FIG. 4 with FIG. 7 shows that the high-frequency amplifying integrated-circuit device 91 of this embodiment of the invention is superior to the prior art device in the following two points.

(1) In the high-frequency amplifying integrated-circuit device 91 of this embodiment, the amount of change in the gain at 10 GHz when the lengths L of the bonding wires 61 to 66 are varied between 240 μm, 300 μm and 360 μm is decreased to be less than that in the prior art.

(2) In the high-frequency amplifying integrated-circuit device 91 of this embodiment, the output end reflection coefficient at 10 GHz is decreased to be less than that in the prior art.

The foregoing experimental results will now be discussed. In a case in which the source electrode 13 is grounded at only one connection section 13*t*1 as in the prior art, the connection electrode 13*s* can be grounded from the point of view of direct current. However, since the connection electrode 13*s* is relatively long, the distance between the grounded connection electrode 13*s* and the first source electrode 13*a* becomes long, and the connection electrode comes to operate pseudomorphically as an inductor at a high frequency region. As a result, when the lengths L of the bonding wires 61 to 66 are varied, the high-frequency amplifying integrated-circuit device 92 becomes likely to receive the influence of the changes in the inductance values of the bonding wires 61 to 66. Therefore, there may be a case where parasitic oscillation occurs in the high-frequency amplifying integrated-circuit device 92, making it impossible to perform a stable amplifying operation.

Therefore, in the above-described high-frequency amplifying integrated-circuit device 91 according to the embodiment of the present invention, it is possible to improve the grounding of the connection electrode 13*s* by grounding both the first source electrode 13*a* and the third source electrode 13*c* by using the two capacitors 31 and 32, and the connection electrode 13*s* can be made not to operate as an inductor even at a high frequency region. Therefore, even if the lengths L of the bonding wires 61 to 66 are varied, it is possible to cause the high-frequency amplifying integrated-circuit device 91 to perform a stable amplifying operation free from parasitic oscillation.

In the above-described high-frequency amplifying integrated-circuit device 91 according to the above-described embodiment of the present invention, the grounding conductor 81 and the grounding conductor 82 are formed electrically separate on the semiconductor substrate 10 and are connected to each other only on the mother board 100. Therefore, the first source electrode 13*a* is grounded via a series resonance circuit formed of the capacitor 32 and the bonding wire 62, and the third source electrode 13*c* is grounded via a series resonance circuit formed of the capacitor 31 and the bonding wire 65. Therefore, even if the lengths L of the bonding wires 61 to 66 are varied, it is possible to cause the high-frequency amplifying integrated-circuit device 91 not to be susceptible to the influence of the changes of the inductance values of the bonding wires 61 to 66, and it is possible to make the high-frequency amplifying integrated-circuit device 91 perform a stable amplifying operation free from parasitic oscillation.

In the above-described high-frequency amplifying integrated-circuit device 91 of this embodiment, by setting the electrostatic capacitance values of the two capacitors 31 and 32 at mutually different values, it is possible to vary the resonance frequency of the series resonance circuit formed of the capacitor 31 and the bonding wire 65 from the resonance frequency of the series resonance circuit formed of the capacitor 32 and the bonding wire 62, and it is possible to relatively decrease the impedance when the grounding conductors 103 and 104 are seen from the source electrode 13 of the field-effect transistor 1 over a wide frequency range. As a result, the frequency range where the high-frequency amplifying integrated-circuit device 91 can be made to stably perform an amplifying operation can be made wider than a case in which the electrostatic capacitance values of the two capacitors 31 and 32 are set at the same value.

Further, in the high-frequency amplifying integrated-circuit device 91 of this embodiment, since the output end reflection coefficient can be decreased to be less than that of the prior art, the high-frequency amplifying integrated-circuit device 91 can be made to perform a stable amplifying operation free from parasitic oscillation.

Generally speaking, when frequency characteristics, such as the S parameter of the field-effect transistor 1, are measured, the measurements are made with the first source electrode 13a and the third source electrode 13c being grounded. Then, the value of each element, such as the capacitors 31 and 32 and the inductors 41 and 42, are measured using the measured S parameter. Therefore, in the high-frequency amplifying integrated-circuit device 91 of this embodiment, since the field-effect transistor 1 is grounded in the same way as the grounded state during the above-described measurement, it is possible to set the value of each element, such as the capacitors 31 and 32 and the inductors 41 and 42, more accurately than that in the prior art by using simulation or the like. As a result, after each element of the high-frequency amplifying integrated-circuit device 91 is set by simulation or the like, there is no need to experimentally manufacture and evaluate the high-frequency amplifying integrated-circuit device 91 and further correct the value of each element. Then, the time needed to develop such a high-frequency amplifying integrated-circuit device 91 can be shortened.

In the high-frequency amplifying integrated-circuit device 91 of this embodiment, since the amount of change of the gain with respect to variations in the lengths L of the bonding wires 61 to 66 can be decreased to be less than that in the prior art, the variations of the gain during manufacture can be decreased, and the high-frequency amplifying integrated-circuit device 91 can be manufactured with a high yield.

Further, the amount of change of the output end reflection coefficient with respect to variations in the lengths L of the bonding wires 61 to 66 can be decreased to be less than that in the prior art.

Since the high-frequency amplifying integrated-circuit device 91 can be manufactured with a high yield as described above, it can be manufactured at a low cost.

[Modification]

In the above-described high-frequency amplifying integrated-circuit device 91 of this embodiment, the section between the grounding conductor 82 and the grounding conductor 104, and the section between the grounding conductor 81 and the grounding conductor 103 are connected by using bonding wires. However, the present invention is not limited to this example, and it is also possible to provide through holes in those portions of the semiconductor substrate 10 where the grounding conductors 81 and 82 are formed, and to connect to the grounding conductors formed on the bottom surface of the semiconductor substrate 10 by using electrodes formed in such through holes. With the above-described construction as well, even if the inductance values of the electrodes formed within the through holes vary, the influence thereof can be reduced. Therefore, the high-frequency amplifying integrated-circuit device of the modification operates in the same way as the high-frequency amplifying integrated-circuit device 91 of the embodiment and has the same advantages.

Although in the above-described high-frequency amplifying integrated-circuit device 91 of this embodiment the field-effect transistor 1 is used, the present invention is not limited to this example, and other transistors, such as high electron mobility transistors (HEMTs) or bipolar transistors may be used. With the above-described construction as well, the high-frequency amplifying integrated-circuit device of the modification operates in the same way as the high-frequency amplifying integrated-circuit device 91 of the embodiment and has the same advantages.

In the high-frequency amplifying integrated-circuit device described herein, since at least two first electrodes are each grounded via a capacitor, the grounding of the first electrodes at a high frequency can be improved, and the high-frequency amplifying integrated-circuit device can be made to perform a stable amplifying operation free from parasitic oscillation.

Since at least two of the above-described grounding conductors are connected to each other outside the semiconductor substrate, the high-frequency amplifying integrated-circuit device can be made to perform a stable amplifying operation free from parasitic oscillation as compared with a case in which the grounding conductors are connected on the semiconductor substrate.

If no more than two first electrodes from among the plurality of first electrodes are each grounded via a capacitor, the grounding of the first electrodes at a high frequency can be improved, so the high-frequency amplifying integrated-circuit device can be made to perform a stable amplifying operation free from parasitic oscillation, and the construction thereof can be simplified, as compared to a case in which two or more first electrodes are grounded each via a capacitor.

Since the electrostatic capacitance values of the two capacitors are set at mutually different values, the frequency range where the high-frequency amplifying integrated-circuit device stably performs an amplifying operation can be widened, as compared to a case in which the electrostatic capacitance values of the two capacitors are set at the same value.

If the electrostatic capacitance value of one of the two capacitors is set at a value in a range of 3 to 50 times as great as the electrostatic capacitance value of the other capacitor, the high-frequency amplifying integrated-circuit device can be made to perform an amplifying operation more stably than a case in which the electrostatic capacitance value of one of the capacitors is set at a value out of the range of 3 to 50 times as great as the electrostatic capacitance value of the other capacitor.

The high-frequency amplifying integrated-circuit device is provided on another substrate, with each terminal-to-terminal space being connected by wire bonding. Therefore, variations in the gain and the output end reflection coefficient, which variations correspond to the variations in the lengths of the bonding wires, can be reduced. As a result, since variations during manufacturing can be reduced more than in the prior art, and the manufacturing yield can be improved, the high-frequency amplifying integrated-circuit device can be manufactured at a low cost.

Many different embodiments of the present invention may be constructed without departing from the spirit and scope of the present invention. It should be understood that the present invention is not limited to the specific embodiment described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. A high-frequency amplifying integrated-circuit device, comprising:

a semiconductor substrate; and a transistor which is formed on said semiconductor substrate and which has a plurality of first electrodes, a plurality of second electrodes, and at least one third electrode, for amplifying a high-frequency signal which is input to said plurality of second electrodes and outputting an amplified signal from said third electrode, wherein at least two first electrodes from among said plurality of first electrodes are each grounded via a respective capacitor, each said respective capacitor being connected to respective portions of said at least two first electrodes so as to prevent said at least two first electrodes from operating as inductors in a predetermined high frequency region.

2. A high-frequency amplifying integrated-circuit device according to claim 1, wherein no more than two of said first electrodes are so grounded.

3. A high-frequency amplifying integrated-circuit device, comprising:

a semiconductor substrate;

a transistor which is formed on said semiconductor substrate and which has a plurality of first electrodes, a plurality of second electrodes, and at least one third electrode, for amplifying a high-frequency signal input to said plurality of second electrodes and outputting an amplified signal from said third electrode, wherein at least two first electrodes from among said plurality of first electrodes are each grounded via a respective capacitor; and at least two grounding conductors which are formed on said semiconductor substrate and to which said at least two first electrodes are connected via said respective capacitors, wherein said at least two grounding conductors are connected to each other only outside said semiconductor substrate.

4. A high-frequency amplifying integrated-circuit device according to claim 3, said high-frequency amplifying integrated-circuit device being provided on a mother substrate and comprising a first terminal connected to said plurality of first electrodes and a second terminal connected to said at least one third electrode, wherein said first terminal, said second terminal and said at least two grounding conductors are each connected by wire bonding to another respective terminal formed on said mother substrate.

5. A high-frequency amplifying integrated-circuit device according claim 3, wherein no more than two of said first electrodes are so grounded.

6. A high-frequency amplifying integrated-circuit device according claim 5, wherein the electrostatic capacitance values of said two capacitors are set at mutually different values.

7. A high-frequency amplifying integrated-circuit device according to claim 6, wherein the electrostatic capacitance value of one of said two capacitors is set at a value within a range of 3 to 50 times as great as the electrostatic capacitance value of the other capacitor.

8. A high-frequency amplifying integrated-circuit device according to claim 7, wherein the capacitance of said one capacitor is 40 times as great as the capacitance of said outer capacitor.

9. A high-frequency amplifying integrated-circuit device according to claim 1, wherein said transistor is an FET, said first electrodes being source electrodes, said second electrodes being gate electrodes, and said third electrode being a drain electrode.

10. A high-frequency amplifying integrated-circuit device comprising:

a semiconductor substrate:

a transistor formed on said substrate, said transistor having a gate electrode, a drain electrode, and a source electrode;

a ground electrode formed on said substrate;

a first capacitor connected between said source electrode and said ground electrode, said first capacitor being connected to a first portion of said source electrode;

a second capacitor connected between said source electrode and said ground electrode, said second capacitor being connected to a second portion of said source electrode;

wherein said first and second portions of said source electrode are at respective positions on said source electrode which are determined so as to prevent said source electrode from operating as an inductor in a predetermined high frequency region.

11. A high-frequency amplifying integrated-circuit device according to claim 10, wherein said source electrode has a plurality of parallel branches, and said branches of said source electrode are interposed with said gate and drain electrodes on the surface of the substrate, and wherein said first capacitor is connected to one of said branches of said source electrode, and said second capacitor is connected to another one of said branches of said source electrode, and said first and second capacitors prevent said source electrode from operating as an inductor in said predetermined high frequency region.

12. A high-frequency amplifying integrated-circuit device, comprising:

a semiconductor substrate; and a transistor which is formed on said semiconductor substrate and which has a plurality of first electrodes, a plurality of second electrodes, and at least one third electrode, for amplifying a high-frequency signal input to said plurality of second electrodes and outputting an amplified signal from said third electrode;

wherein at least two first electrodes from among said plurality of first electrodes are each grounded via a respective capacitor; and further comprising at least two grounding conductors which are formed on said semiconductor substrate and to which said at least two first electrodes are connected via said respective capacitors, wherein said at least two grounding conductors are connected to each other only outside said semiconductor substrate.

13. A high-frequency amplifying integrated-circuit device according to claim 12, said high-frequency amplifying integrated-circuit device being provided on a mother substrate and comprising a first terminal connected to said plurality of first electrodes and a second terminal connected to said at least one third electrode, wherein said first terminal, said second terminal and said at least two grounding conductors are each connected by wire bonding to another respective terminal formed on said mother substrate.

14. A high-frequency amplifying integrated-circuit device according claim 12, wherein no more than two of said first electrodes are so grounded.

15. A high-frequency amplifying integrated-circuit device according claim 14, wherein the electrostatic capacitance values of said two capacitors are set at mutually different values.

16. A high-frequency amplifying integrated-circuit device according to claim 15, wherein the electrostatic capacitance value of one of said two capacitors is set at a value within a range of 3 to 50 times as great as the electrostatic capacitance value of the other capacitor.

17. A high-frequency amplifying integrated-circuit device according to claim 16, wherein the capacitance of said one capacitor is 40 times as great as the capacitance of said outer capacitor.

18. A high-frequency amplifying integrated-circuit device according to claim 12, wherein no more than two of said first electrodes are so grounded.

19. A high-frequency amplifying integrated-circuit device according to claim 12, wherein said transistor is an FET, said first electrodes being source electrodes, said second electrodes being gate electrodes, and said third electrode being a drain electrode.

20. A high-frequency amplifying integrated-circuit device according claim 10, wherein the electrostatic capacitance values of said two capacitors are set at mutually different values.

21. A high-frequency amplifying integrated-circuit device according to claim 20, wherein the electrostatic capacitance value of one of said two capacitors is set at a value within a range of 3 to 50 times as great as the electrostatic capacitance value of the other capacitor.

22. A high-frequency amplifying integrated-circuit device according to claim 21, wherein the capacitance of said one capacitor is 40 times as great as the capacitance of said outer capacitor.

23. A high-frequency amplifying integrated-circuit device according to claim 3, each said respective capacitor being connected to respective portions of said at least two first electrodes so as to prevent said at least two first electrodes from operating as inductors in a predetermined high frequency region.

24. A high-frequency amplifying integrated-circuit device according to claim 4, each said respective capacitor being connected to respective portions of said at least two first electrodes so as to prevent said at least two first electrodes from operating as inductors in a predetermined high frequency region.

25. A high-frequency amplifying integrated-circuit device according to claim 5, each said respective capacitor being connected to respective portions of said at least two first electrodes so as to prevent said at least two first electrodes from operating as inductors in a predetermined high frequency region.

26. A high-frequency amplifying integrated-circuit device according to claim 6, each said respective capacitor being connected to respective portions of said at least two first electrodes so as to prevent said at least two first electrodes from operating as inductors in a predetermined high frequency region.

27. A high-frequency amplifying integrated-circuit device according to claim 7, each said respective capacitor being connected to respective portions of said at least two first electrodes so as to prevent said at least two first electrodes from operating as inductors in a predetermined high frequency region.

28. A high-frequency amplifying integrated-circuit device according to claim 8, each said respective capacitor being connected to respective portions of said at least two first electrodes so as to prevent said at least two first electrodes from operating as inductors in a predetermined high frequency region.

* * * * *